US 9,915,978 B2

United States Patent
Dabby et al.

(10) Patent No.: US 9,915,978 B2
(45) Date of Patent: Mar. 13, 2018

(54) METHOD OF FABRICATING A STRETCHABLE COMPUTING DEVICE

(71) Applicant: Intel Corporation, Santa Clara, CA (US)

(72) Inventors: Nadine L. Dabby, Palo Alto, CA (US); Lakshman Krishnamurthy, Portland, OR (US); Braxton Lathrop, Lake Oswego, OR (US); Aleksandar Aleksov, Chandler, AZ (US); Adel Elsherbini, Chandler, AZ (US); Sasha Oster, Chandler, AZ (US); Tom L. Simmons, Newbury Park, CA (US)

(73) Assignee: intel Corporaiton, Santa Clara, CA (US)

( * ) Notice: Subject to any disclaimer, the term of this patent is extended or adjusted under 35 U.S.C. 154(b) by 168 days.

(21) Appl. No.: 14/859,894

(22) Filed: Sep. 21, 2015

(65) Prior Publication Data
US 2017/0083051 A1    Mar. 23, 2017

(51) Int. Cl.
*H05K 3/30* (2006.01)
*G06F 1/16* (2006.01)

(52) U.S. Cl.
CPC ........ *G06F 1/1633* (2013.01); *H01L 2924/00* (2013.01)

(58) Field of Classification Search
CPC ............... G06F 1/1633; H01L 2924/00; H01L 23/4985; H01L 2924/3011; B29C 59/02;
(Continued)

(56) References Cited

U.S. PATENT DOCUMENTS 6,600,222 B1    7/2003 Levardo
8,883,287 B2 *  11/2014 Boyce .................... B29C 59/02
                                                    174/254
(Continued)

FOREIGN PATENT DOCUMENTS

WO    WO-2013119471 A1    8/2013

OTHER PUBLICATIONS

"International Application Serial No. PCT/US2016/048230, International Search Report dated Nov. 30, 2016", 3 pgs.
(Continued)

*Primary Examiner* — Paul D Kim
(74) *Attorney, Agent, or Firm* — Schwegman Lundberg & Woessner, P.A.

(57) ABSTRACT

Some forms relate to a method of making a stretchable computing system. The method includes attaching a first set of conductive traces to a stretchable member; attaching a first electronic component to the first set of conductive traces; adding a first set of flexible conductors to the stretchable member such that the first set of flexible conductors is electrically connected to the first set of conductive traces; adding stretchable material to the stretchable member such that the first set of conductive traces is surrounded by the stretchable member; forming an opening in the stretchable member that exposes the first set of conductive traces; and attaching a second set of conductive traces to the stretchable member such that the second set of conductive traces fills the opening to form a via in the stretchable member that electrically connects the first set of conductive traces with the second set of conductive traces.

5 Claims, 10 Drawing Sheets

(58) Field of Classification Search
CPC .............. B29C 59/16; B29C 2791/009; B29C 2793/00; H05K 1/0283; H05K 2201/0133; H05K 2201/09063; B32B 3/266

See application file for complete search history.

(56) References Cited

U.S. PATENT DOCUMENTS

| | | | |
|---|---|---|---|
| 9,554,465 B1* | 1/2017 | Liu | H05K 1/092 |
| 2002/0026980 A1* | 3/2002 | Nakatani | B32B 15/08 |
| | | | 156/252 |
| 2010/0238636 A1* | 9/2010 | Mascaro | B29C 45/14639 |
| | | | 361/750 |
| 2011/0013373 A1 | 1/2011 | Lin et al. | |
| 2011/0317387 A1 | 12/2011 | Pan et al. | |
| 2015/0131239 A1 | 5/2015 | Ha et al. | |

OTHER PUBLICATIONS

"International Application Serial No. PCT/US2016/048230, Written Opinion dated Nov. 30, 2016", 7 pgs.

* cited by examiner

ONE PIECE CONDUCTIVE TRACE

CONDUCTIVE TRACE SOLDERED TO PILLAR

ATTACH DIE PACKAGE 1 TO SECOND SET OF CONDUCTIVE TRACES
AND ADD SECOND SET OF FLEXIBLE CONDUCTORS

ADD ADDITIONAL STRETCHABLE MATERIAL

FINAL PRODUCT

METHOD OF FABRICATING A STRETCHABLE COMPUTING DEVICE

TECHNICAL FIELD

Embodiments described herein generally relate to a computing device, and more particularly to a method of fabricating a stretchable computing device.

BACKGROUND

Conventional manufacturing techniques typically suffer from the problem associated with only utilizing one layer for electronic traces. Utilizing one layer for electronic traces is severely limiting in terms of the complexity of a circuit that may be designed into a stretchable computing device. Many existing electronic packages and boards utilize multiple layers in order to more densely pack electronic devices into a smaller X-Y electronic package.

Some textile manufacturers are experimenting with crocheting and knitting conductive yarn into more than one layer of conductive fabric, but this technique results in an electronic fabric that is difficult to encapsulate or weatherproof. In addition, the electronic yarn and thread suffer from fibers that break easily thus degrading electronic signals very quickly.

Therefore, a need exists for a method of fabricating a stretchable computing device that may integrate various sensors, power supplies and electronic packages. Stretchable computing devices may enable various approaches to managing different types of applications (e.g., wearable applications) where computing power may be utilized to enhance the application.

BRIEF DESCRIPTION OF THE DRAWINGS

FIGS. 5A-5I show schematic views of still another example method of fabricating a stretchable computing device.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example methods and stretchable computing systems described herein may include a variety of electronics. Some examples include a power supply and/or a communication device (among other types of electronics).

Figure 2:
FIG. 2 is a schematic view illustrating an example conductor that has been fabricated to form a pillar onto a conductive layer.
Figure 1:
FIG. 1 is a schematic view illustrating an example pillar that has been soldered on to a conductive layer.
Figure 3A:
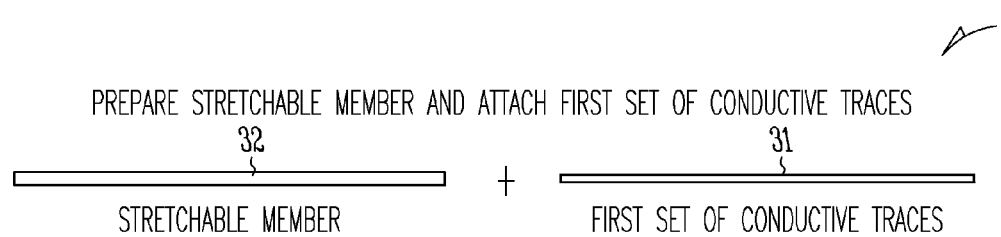
FIGS. 3A-3H show schematic views of an example method of fabricating a stretchable computing device.
Figure 3B:
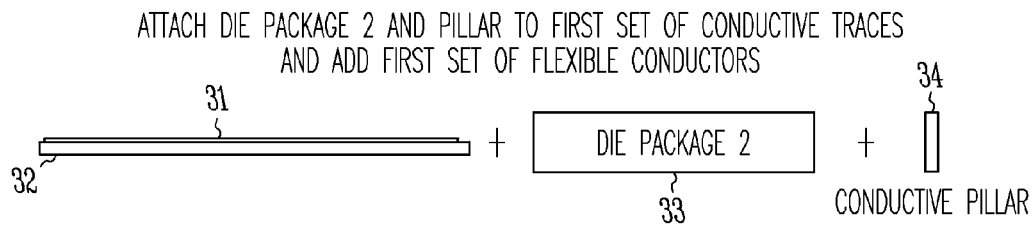
Figure 3C:
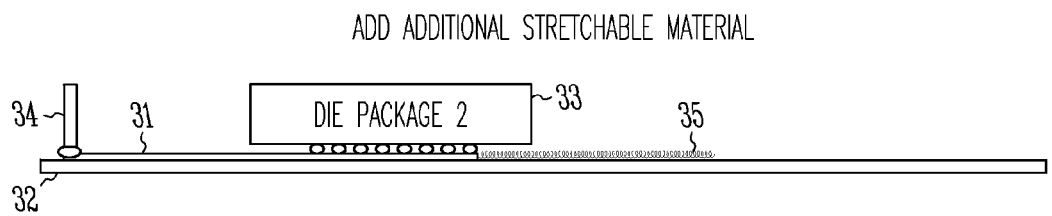
Figure 3D:
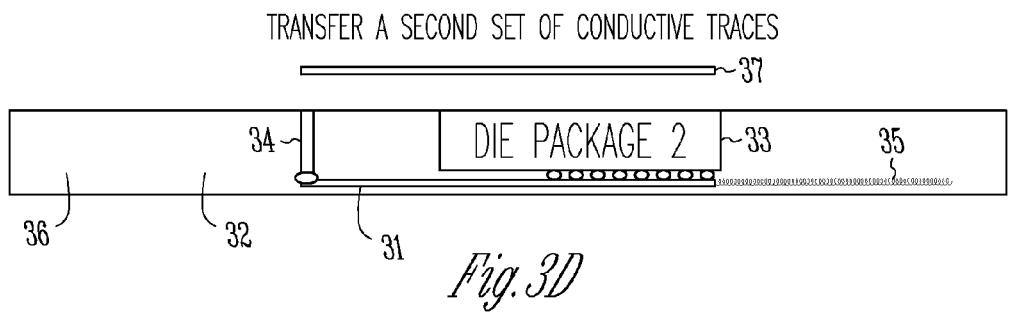
Figure 3E:
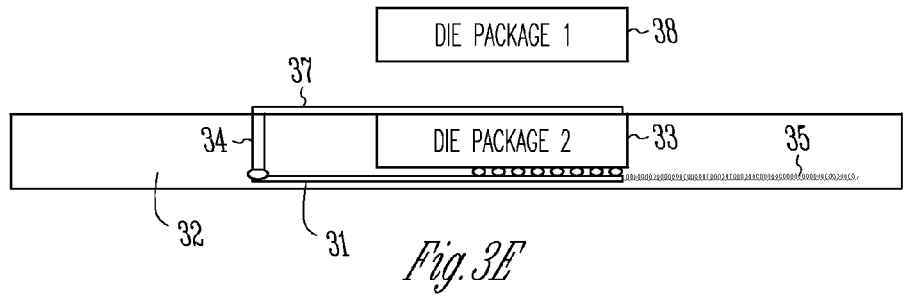
Figure 3F:
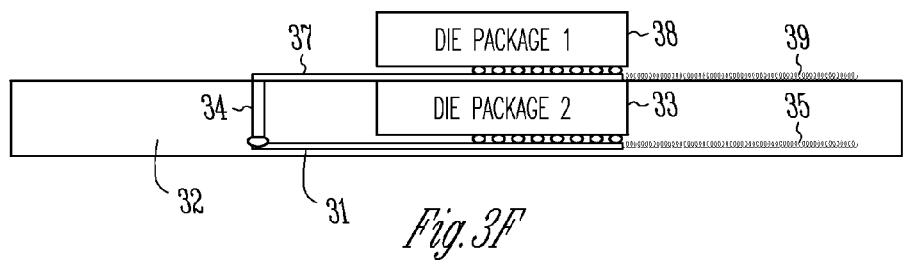
Figure 3G:
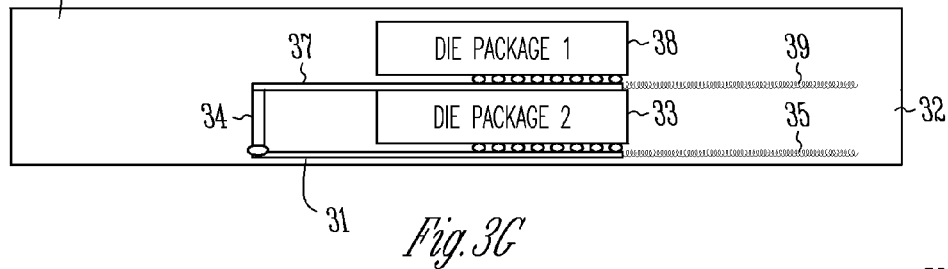
Figure 3H:
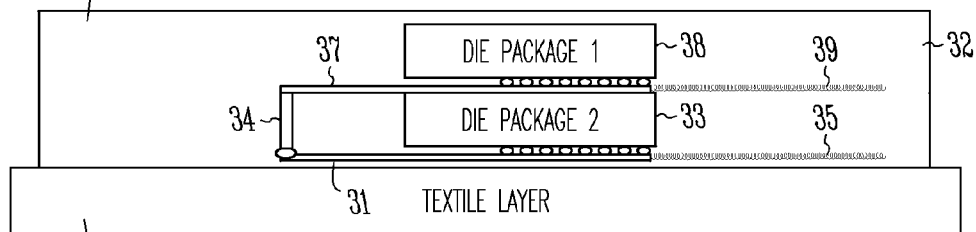
Figure 4A:
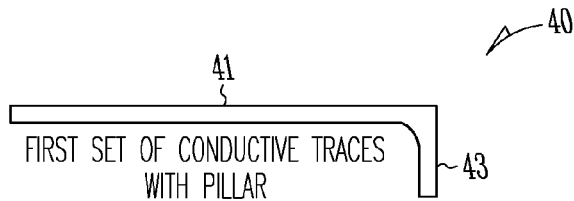
FIGS. 4A-4I show schematic views of another example method of fabricating a stretchable computing device.
Figure 4B:
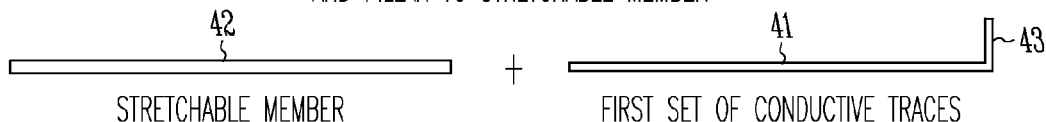
Figure 4C:
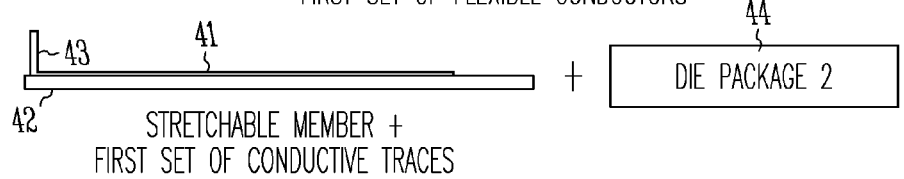
Figure 4D:
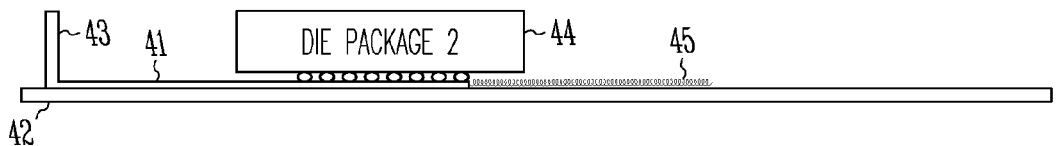
Figure 4E:
Figure 4F:
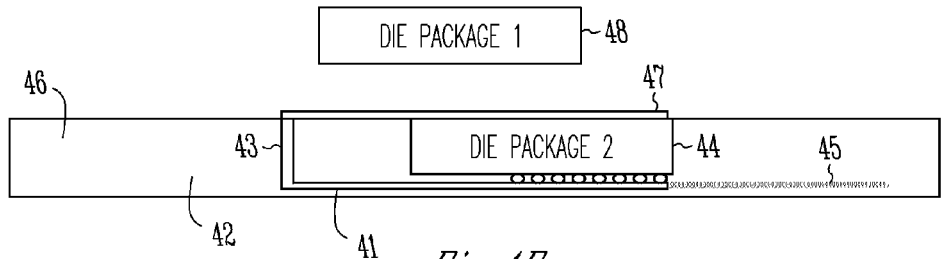
Figure 4G:
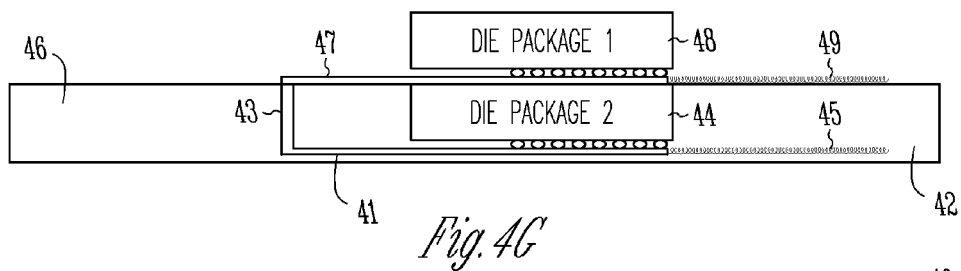
Figure 4H:
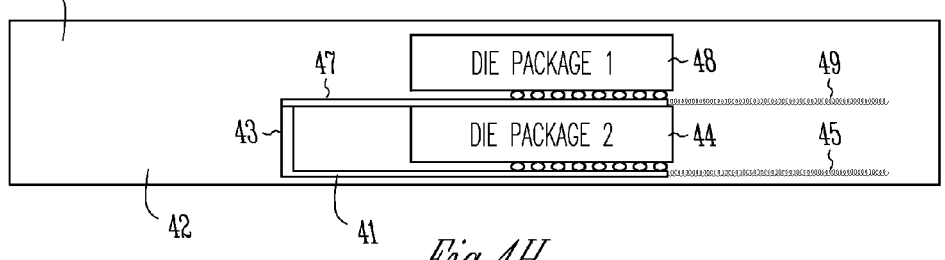
Figure 4I:
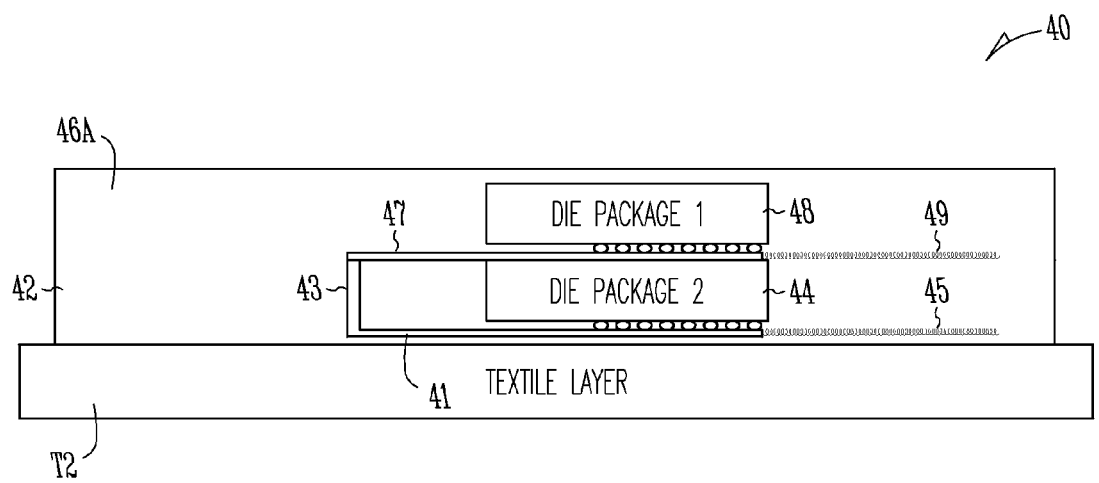
Figure 5A:
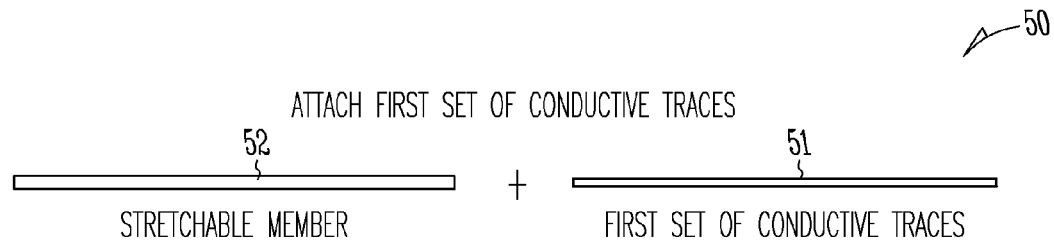
Figure 5B:
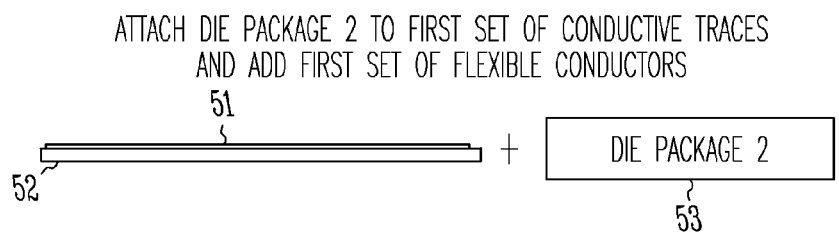

In some forms, the example stretchable computing systems may be integrated with (or attached to) textiles (i.e. clothing) (see FIGS. 3H, 4I, 5I). In other forms, the example stretchable computing systems may be attached directly to the skin of someone (i.e., similar to a bandage) that utilizes any of the example stretchable computing systems described herein.

As used herein "stretchable" refers to the ability elongate in the direction of an applied force. The amount of stretching will be determined in part based on the application where any of the example methods described herein are to be used. As an example, the degree of stretching may be different when the example stretchable computing devices described herein are integrated with (or detachably connected to) textiles (e.g., clothing) as opposed when the example stretchable computing devices described herein are attached directly to the skin of someone that utilizes any of the example stretchable computing systems.

The example methods described herein may create multi-layered electronics by integrating vias to connect multiple layers of electronic traces within a stretchable member (which may be subsequently integrated into textiles).

FIGS. 3A-3H show schematic views of an example method of fabricating a stretchable computing device 30. The method includes attaching a first set of conductive traces 31 to a stretchable member 32 and attaching a first electronic component 33 and a conductive pillar 34 to the first set of conductive traces 31 (see FIG. 1 and FIGS. 3A-3C).

The method further includes adding a first set of flexible conductors 35 to the stretchable member 32 such that the first set of flexible conductors 35 are electrically connected to the first set of conductive traces 31 (see FIG. 3C). The method further includes adding stretchable material 36 to the stretchable member 32 such that the first set of conductive traces 31 and the conductive pillar 34 are at least partially surrounded by the stretchable member 32 (see FIG. 3D), and attaching a second set of conductive traces 37 to the stretchable member 32 such that the second set of conductive traces 37 is electrically connected to the conductive pillar 34 (see FIG. 3E). The method further includes attaching a second electronic component 38 to the second set of conductive traces 37 (see FIG. 3F), and adding a second set of flexible conductors 39 to the stretchable member 32 such that the second set of flexible conductors 39 are electrically connected to the second set of conductive traces 37 (see FIG. 3F).

In some forms, the stretchable member 32 may be an elastomer. It should be noted that the stretchable member may be any material that is stretchable in one or more directions. The type of material that is utilized in the method will depend in part on the application where the stretchable computing system is to be used.

Attaching a first electronic component 33 and a conductive pillar 34 to the first set of conductive traces 31 may include soldering a first die 33 and the conductive pillar 34 to the first set of conductive traces 31. In addition, attaching a second electronic component 38 to the second set of conductive traces 37 may include soldering a second die 38 to the second set of conductive traces 38.

In some forms, adding a first set of flexible conductors 35 to the stretchable member 32 may include adding meandering conductors to the stretchable member 32. In addition, adding a second set of flexible conductors 39 to the stretchable member 32 may include adding meandering conductors to the stretchable member 32.

The method may further include adding additional stretchable material 36A to the stretchable member 32 such that the second set of conductive traces 37 and a second component 38 are at least partially surrounded by the stretchable member 32.

It should be noted that adding the first set of flexible conductors 35 to the stretchable member 32 may include screen printing the first set of flexible conductors 35 on to the stretchable member 32. In addition, adding the second set of flexible conductors 39 to the stretchable member 32 may include screen printing the second set of flexible conductors 39 on to the stretchable member 32.

FIG. 3H shows a textile layer T1 added to the stretchable computing system 30. The type of textile T1 that is added to the stretchable computing system 30 will depend on the application where the stretchable computing system 30 is to be used. As an example, the textile layer T1 may be part of a garment or some type of fabric (among many other possible applications).

FIGS. 4A-4I show a schematic view of another example method of fabricating a stretchable computing system 40. The method of making a stretchable computing system includes attaching a first set of conductive traces 41 to a stretchable member 42 (see FIGS. 4A and 4B). The first layer of conductive traces 41 includes a conductive pillar 43.

The method further includes attaching a first electronic component 44 to the first set of conductive traces 41 (see FIGS. 4C and 4D) and adding a first set of flexible conductors 45 to the stretchable member 42 such that the first set of flexible conductors 45 is electrically connected to the first set of conductive traces 41 (see FIG. 4D). The method further includes adding stretchable material 46 to the stretchable member 42 such that the first set of conductive traces 41 and the conductive pillar 43 are at least partially surrounded by the stretchable member 42 (see FIG. 4E).

The method further includes attaching a second set of conductive traces 47 to the stretchable member 42 such that the second set of conductive traces 47 is electrically connected to the conductive pillar 43 (see FIG. 4F), and attaching a second electronic component 48 to the second set of conductive traces 47 (see FIG. 4G). The method further includes adding a second set of flexible conductors 49 to the stretchable member 42 such that the second set of flexible conductors 49 is electrically connected to the second set of conductor traces 47 (see FIG. 4G).

As discussed above, the stretchable member 42 may be an elastomer. In addition, the stretchable member 42 may be any material that facilitates fabrication of the stretchable computing system 40.

In some forms, attaching a first electronic component 44 to the first set of conductive traces 41 may include soldering a first die 44 to the first set of conductive traces 41. In addition, attaching a second electronic component 48 to the second set of conductive traces 47 may include soldering a second die 48 to the second set of conductive traces 47.

Adding a first set of flexible conductors 45 to the stretchable member 42 may include adding meandering conductors to the stretchable member 42. In addition, adding a second set of flexible conductors 49 to the stretchable member 42 may include adding meandering conductors to the stretchable member 42. The size and shape of the meandering conductors will depend in part on the overall size of the first and second electronic components as well as the distance between the first and second electronic components 44, 48 (among other factors).

As shown in FIG. 4H, the method may further include adding additional stretchable material 46A to the stretchable member 42 such that the second set of conductive traces 47 and the second component 48 are at least partially surrounded by the stretchable member 42. In some forms, adding the first set of flexible conductors 45 to the stretchable member 42 may include screen printing the first set of flexible conductors 45 on to the stretchable member 42. In addition, adding the second set of flexible conductors 49 to the stretchable member 42 may include screen printing the second set of flexible conductors 49 on to the stretchable member 42.

FIG. 4I shows a textile layer T2 added to the stretchable computing system 40. The type of textile T2 that is added to the stretchable computing system 40 will depend on the application where the stretchable computing system 40 is to be used. As an example, the textile layer T2 may be part of a garment or some type of fabric (among many other possible applications).

FIGS. 5A-5I show schematic views of still another example method of fabricating a stretchable computing system 50. The method of making a stretchable computing system 50 includes attaching a first set of conductive traces 51 to a stretchable member 52 (see FIGS. 5A and 5B).

Figure 5C:
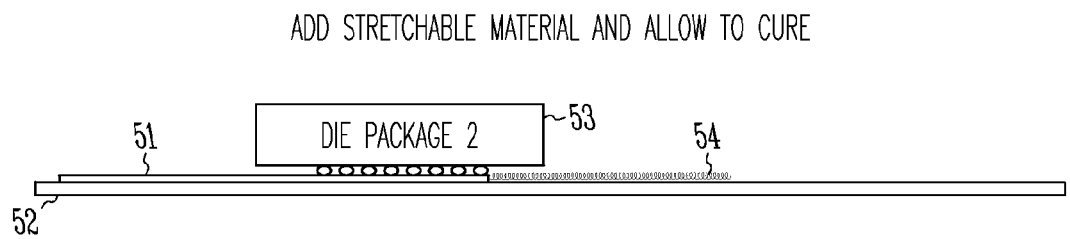
Figure 5D:
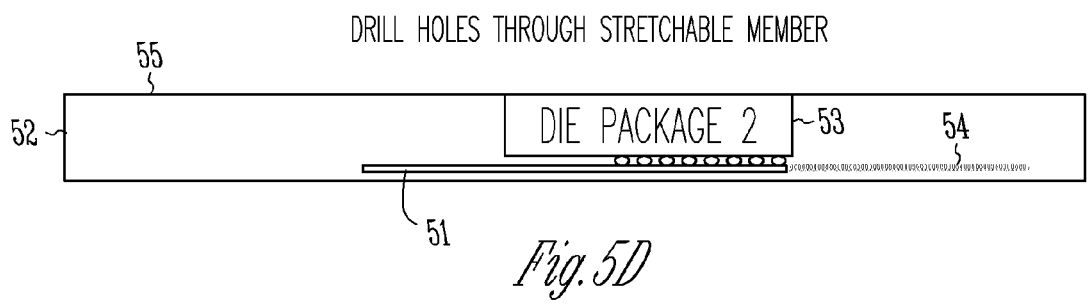
Figure 5E:

The method further includes attaching a first electronic component 53 to the first set of conductive traces 51 (see FIG. 5C), and adding a first set of flexible conductors 54 to the stretchable member 52 such that the first set of flexible conductors 54 is electrically connected to the first set of conductive traces 51 (see FIG. 5C). The method further includes adding stretchable material 55 to the stretchable member 52 such that the first set of conductive traces 51 and the first electronic component 53 are at least partially surrounded by the stretchable member 52 (see FIG. 5D), and forming an opening 56 in the stretchable member 52 that exposes the first set of conductive traces 51 (see FIG. 5E).

Figure 5F:
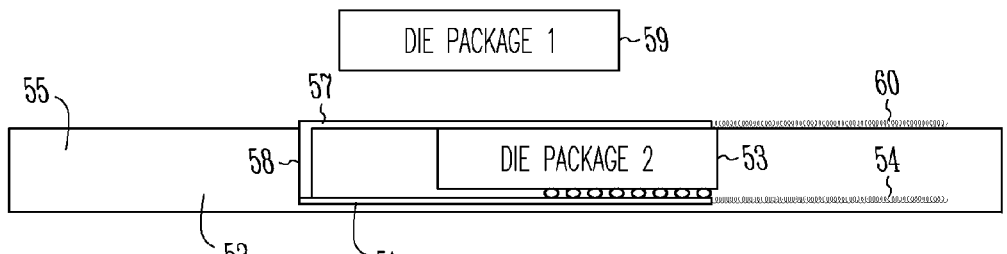
Figure 5G:
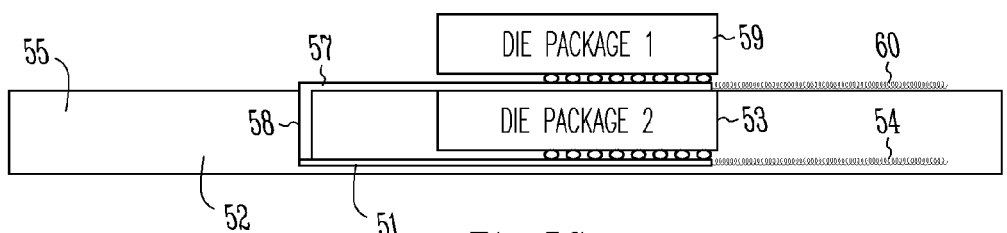
Figure 5H:
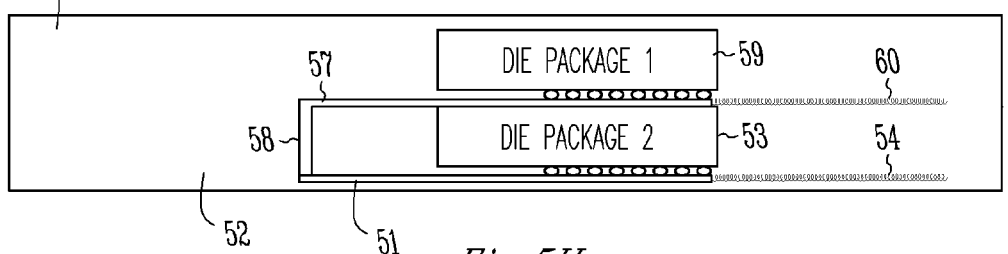
Figure 51:
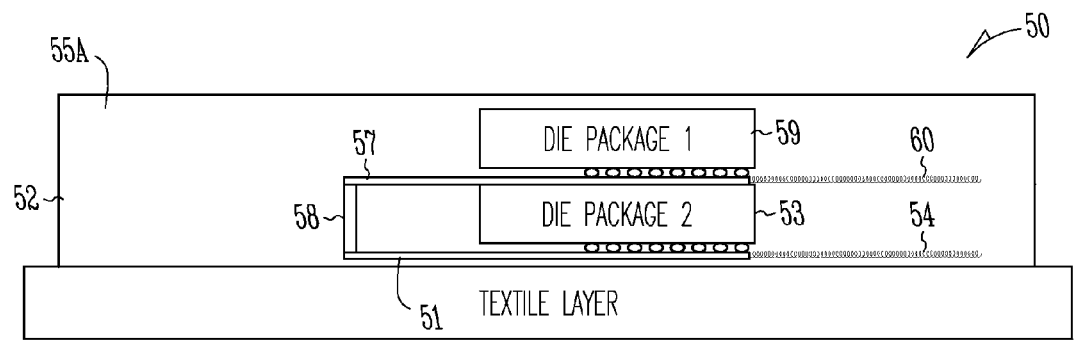

The method further includes attaching a second set of conductive traces 57 to the stretchable member 52 such that the second set of conductive traces 57 fills the opening 56 to form a via 58 in the stretchable member 52 that electrically connects the first set of conductive traces 51 with the second set of conductive traces 57 (see FIG. 5F). The method further includes attaching a second electronic component 59 to the second set of conductive traces 57 on the stretchable member 52 (see FIG. 5G), and adding a second set of flexible conductors 60 to the stretchable member 52 such that the second set of flexible conductors 60 are electrically connected to the second set of conductive traces 57 (see FIG. 5F). In some forms, forming an opening 56 in the stretchable member 52 that exposes the first set of conductive traces 51 includes laser drilling the opening 56 in the stretchable member 52. Some forms of laser drilling include, but are not limited to, using infrared and ultraviolet radiation as well as using a green laser.

It should be noted that a variety of processes for forming the opening 56 are contemplated. As examples, the opening 56 may be formed by mechanical drilling, using a photoresist define openings and then etching (e.g., by reactive ion etching). The manner in which the opening 56 is formed in the stretchable member 52 will depend in part on the size of the opening 56 as well as the type of material that is used for the stretchable member 52 (among other factors).

The method further includes adding additional stretchable material 55A to the stretchable member 52. In some forms, the second set of conductive traces 57 and the second component 58 may be at least partially (or fully) surrounded by the stretchable member 52 once the additional stretchable material 55A is added to the stretchable member 52.

FIG. 5I shows a textile layer T3 added to the stretchable computing system 50. The type of textile T3 that is added to the stretchable computing system 50 will depend on the application where the stretchable computing system 50 is to be used. As an example, the textile layer T3 may be part of a garment or some type of fabric (among many other possible applications).

Figure 6:
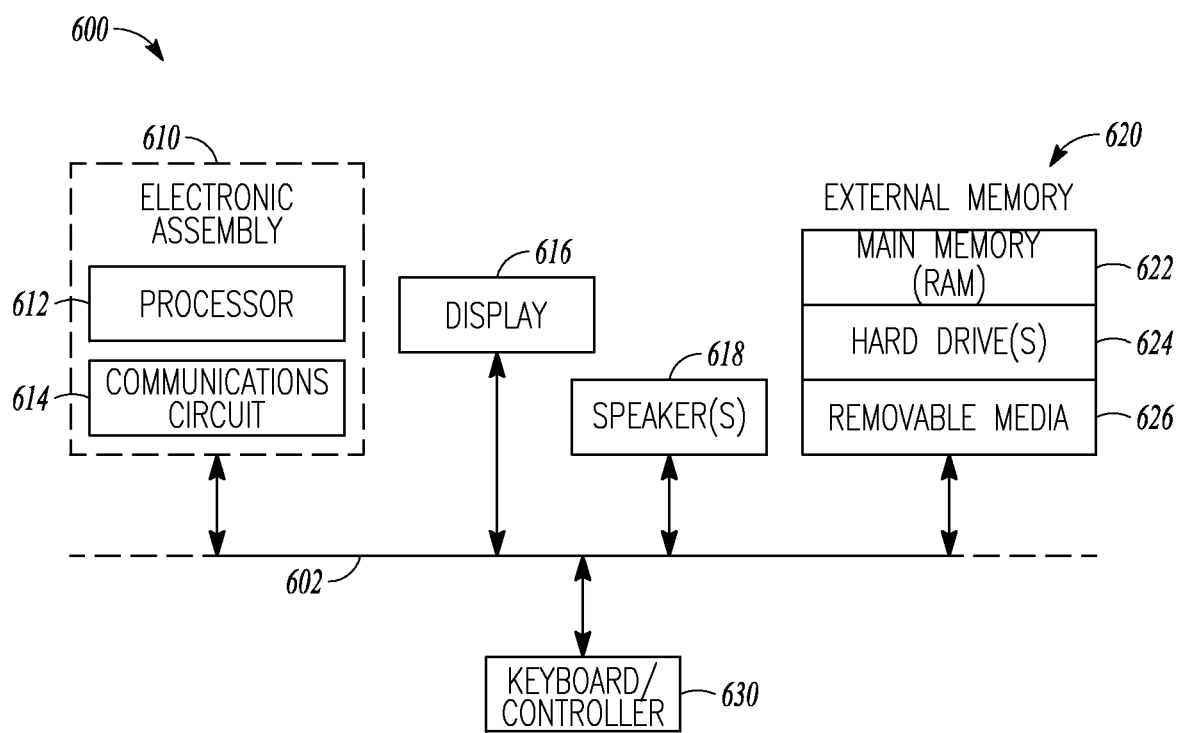
FIG. 6 is block diagram of an electronic apparatus that includes the electronic assemblies and/or the electronic packages described herein.

FIG. 6 is a block diagram of an electronic apparatus 600 incorporating at least one of the methods described herein. Electronic apparatus 600 is merely one example of an electronic apparatus in which forms of the methods described herein may be used. Examples of an electronic apparatus 600 include, but are not limited to, personal computers, tablet computers, mobile telephones, game devices, MP3 or other digital media players, etc. In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic apparatus 600 as describe herein may be coupled to system bus 602. The electronic apparatus 600 may include any circuit or combination of circuits. In one embodiment, the electronic apparatus 600 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 600 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch pad, voice-recognition device, or any other device that permits a system user to input information into and receive information from the electronic apparatus 600.

To better illustrate the methods disclosed herein, a non-limiting list of examples is provided herein:

Example 1 is a stretchable computing system that includes a first set of conductive traces attached to a stretchable member; a first electronic component and a conductive pillar attached to the first set of conductive traces; a first set of flexible conductors attached to the stretchable member such that the first set of flexible conductors is electrically connected to the first set of conductive traces; a stretchable material added to the stretchable member such that the first set of conductive traces and the conductive pillar are at least partially surrounded by the stretchable member; a second set of conductive traces attached to the stretchable member such that the second set of conductive traces is electrically connected to the pillar; a second electronic component attached to the second set of conductive traces; and a second set of flexible conductors added to the stretchable member such that the second set of flexible conductors is electrically connected to the second set of conductive traces.

Example 2 includes the a stretchable computing system of example 1, wherein the conductive pillar is integral with the first set of conductive traces.

Example 3 includes the stretchable computing system of any one of examples 1-2, wherein the conductive pillar is soldered to the first set of conductive traces.

Example 4 includes the stretchable computing system of any one of examples 1-3, wherein the conductive pillar is a via that is part of the second set of conductive traces and fills an opening in the stretchable member.

Example 5 includes the stretchable computing system of examples 1-4, wherein the stretchable member is an elastomer.

Example 6 includes the stretchable computing system of any one of examples 1-5, wherein the first set of flexible conductors are meandering conductors, wherein the second set of flexible conductors are meandering conductors.

Example 7 includes the stretchable computing system of any one of examples 1-6, wherein the first set of flexible conductors and the second set of flexible conductors are formed of conductive ink.

Example 8 includes the stretchable computing system of any one of examples 1-7, wherein the first electronic component is an electronic package and the second electronic component is an electronic package.

Example 9 includes the stretchable computing system of example 8, and further including additional stretchable material attached to the stretchable member such that the second set of conductive traces and the second component are at least partially surrounded by the stretchable member.

Example 10 includes a method of making a stretchable computing system. The method of making a stretchable computing system includes attaching a first set of conductive traces to a stretchable member; attaching a first electronic component and a conductive pillar to the first set of conductive traces; adding a first set of flexible conductors to the stretchable member such that the first set of flexible conductors is electrically connected to the first set of conductive traces; adding stretchable material to the stretchable member such that the first set of conductive traces and the conductive pillar are at least partially surrounded by the stretchable member; attaching a second set of conductive traces to the stretchable member such that the second set of conductive traces is electrically connected to the pillar; attaching a second electronic component to the second set of conductive traces; and adding a second set of flexible conductors to the stretchable member such that the second set of flexible conductors is electrically connected to the second set of conductive traces.

Example 11 includes the method of making a stretchable computing system of example 10, wherein attaching a first electronic component and a conductive pillar to the first set of conductive traces includes soldering a first die and the conductive pillar to the first set of conductive traces, and wherein attaching a second electronic component to the second set of conductive traces includes soldering a second die to the second set of conductive traces.

Example 12 includes the method of making a stretchable computing system of any one of examples 10-11, wherein adding a first set of flexible conductors to the stretchable member includes adding meandering conductors to the stretchable member, and wherein adding a second set of flexible conductors to the stretchable member includes adding meandering conductors to the stretchable member.

Example 13 includes the method of making a stretchable computing system of any one of examples 10-12, and further including adding additional stretchable material to the stretchable member such that the second set of conductive traces and the second component are at least partially surrounded by the stretchable member.

Example 14 includes the method of making a stretchable computing system of any one of examples 10-13, wherein adding the first set of flexible conductors to the stretchable member includes screen printing the first set of flexible conductors on to the stretchable member, and wherein adding the second set of flexible conductors to the stretchable member includes screen printing the second set of flexible conductors on to the stretchable member.

Example 15 includes a method of making a stretchable computing system. The method of making a stretchable computing system includes attaching a first set of conductive traces to a stretchable member, wherein the first layer of conductive traces includes a pillar; attaching a first electronic component to the first set of conductive traces; adding a first set of flexible conductors to the stretchable member such that the first set of flexible conductors is electrically connected to the first set of conductive traces; adding stretchable material to the stretchable member such that the first set of conductive traces and the conductive pillar are at least partially surrounded by the stretchable member; attaching a second set of conductive traces to the stretchable member such that the second set of conductive traces is electrically connected to the pillar; attaching a second electronic component to the second set of conductive traces; and adding a second set of flexible conductors to the stretchable member such that the second set of flexible conductors are electrically connected to the second set of conductive traces.

Example 16 includes the method of making a stretchable computing system of example 15, wherein attaching a first electronic component to the first set of conductive traces includes soldering a first die to the first set of conductive traces, and wherein attaching a second electronic component to the second set of conductive traces includes soldering a second die to the second layer of conductive traces.

Example 17 includes the method of making a stretchable computing system of any one of examples 15-16, wherein adding a first set of flexible conductors to the stretchable member includes adding meandering conductors to the stretchable member, and wherein adding a second set of flexible conductors to the stretchable member includes adding meandering conductors to the stretchable member.

Example 18 includes the method of making a stretchable computing system of any one of examples 15-17, and further including adding additional stretchable material to the stretchable member such that the second set of conductive traces and the second component are at least partially surrounded by the stretchable member.

Example 19 includes the method of making a stretchable computing system of any of the examples 15-18, wherein adding the first set of flexible conductors to the stretchable member includes screen printing the first set of flexible conductors on to the stretchable member, and wherein adding the second set of flexible conductors to the stretchable member includes screen printing the second set of flexible conductors on to the stretchable member.

Example 20 includes a method of making a stretchable computing system. The method of making a stretchable computing system includes attaching a first set of conductive traces to a stretchable member; attaching a first electronic component to the first set of conductive traces; adding a first set of flexible conductors to the stretchable member such that the first set of flexible conductors is electrically connected to the first set of conductive traces; adding stretchable material to the stretchable member such that the first set of conductive traces is surrounded by the stretchable member; forming an opening in the stretchable member that exposes the first set of conductive traces; attaching a second set of conductive traces to the stretchable member such that the second set of conductive traces fills the opening to form a via in the stretchable member that electrically connects the first set of conductive traces with the second set of conductive traces; attaching a second electronic component to the second set of conductive traces on the stretchable member; and adding a second set of flexible conductors to the stretchable member such that the second set of flexible conductors is electrically connected to the second set of conductive traces.

Example 21 includes the method of making a stretchable computing system of examples 20, wherein attaching a first electronic component to the first set of conductive traces includes soldering a first die to the first set of conductive traces, and wherein attaching a second electronic component to the second set of conductive traces includes soldering a second die to the second layer of conductive traces.

Example 22 includes the method of making a stretchable computing system of any one of examples 20-21, wherein adding a first set of flexible conductors to the stretchable member includes adding meandering conductors to the stretchable member, and wherein adding a second set of flexible conductors to the stretchable member includes adding meandering conductors to the stretchable member.

Example 23 includes the method of making a stretchable computing system of any of examples 20-22, and further including adding additional stretchable material to the stretchable member such that the second set of conductive traces and the second component are at least partially surrounded by the stretchable member.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of making a stretchable computing system, comprising:

attaching a first set of conductive traces to a stretchable member;

attaching a first electronic component and a conductive pillar to the first set of conductive traces;

adding a first set of flexible conductors to the stretchable member such that the first set of flexible conductors is electrically connected to the first set of conductive traces;

adding stretchable material to the stretchable member such that the first set of conductive traces and the conductive pillar are at least partially surrounded by the stretchable member;

attaching a second set of conductive traces to the stretchable member such that the second set of conductive traces is electrically connected to the pillar;

attaching a second electronic component to the second set of conductive traces; and adding a second set of flexible conductors to the stretchable member such that the second set of flexible conductors is electrically connected to the second set of conductive traces.

2. The method of claim 1, wherein attaching a first electronic component and a conductive pillar to the first set of conductive traces includes soldering a first die and the conductive pillar to the first set of conductive traces, and wherein attaching a second electronic component to the second set of conductive traces includes soldering a second die to the second set of conductive traces.

3. The method of claim 1, wherein adding a first set of flexible conductors to the stretchable member includes adding meandering conductors to the stretchable member, and wherein adding a second set of flexible conductors to the stretchable member includes adding meandering conductors to the stretchable member.

4. The method of claim 1, further comprising adding additional stretchable material to the stretchable member such that the second set of conductive traces and the second component are at least partially surrounded by the stretchable member.

5. The method of claim 1, wherein adding the first set of flexible conductors to the stretchable member includes screen printing the first set of flexible conductors on to the stretchable member, and wherein adding the second set of flexible conductors to the stretchable member includes screen printing the second set of flexible conductors on to the stretchable member.

* * * * *